(12) United States Patent
Machesney (10) Patent No.: US 7,760,829 B2
(45) Date of Patent: Jul. 20, 2010

(54) DENSE-TAP TRANSVERSAL FILTER WITH ELEMENTARY COEFFICIENTS

(75) Inventor: Brian Machesney, Craftsbury Common, VT (US)

(73) Assignee: Altera Corporation, San Jose, CA (US)

( * ) Notice: Subject to any disclaimer, the term of this patent is extended or adjusted under 35 U.S.C. 154(b) by 1115 days.

(21) Appl. No.: 11/414,225

(22) Filed: May 1, 2006

(65) Prior Publication Data

US 2006/0251199 A1 Nov. 9, 2006

Related U.S. Application Data (60) Provisional application No. 60/677,356, filed on May 4, 2005.

(51) Int. Cl.
*H04B 1/10* (2006.01)
*H03D 3/24* (2006.01)
(52) U.S. Cl. .......................... 375/350; 375/376
(58) Field of Classification Search ............. 375/350, 375/376
See application file for complete search history.

(56) References Cited

U.S. PATENT DOCUMENTS

| | | |
|---|---|---|
| 5,387,887 A | 2/1995 | Zimmerman et al. |
| 6,377,094 B1 | 4/2002 | Carley |
| 6,664,832 B2 | 12/2003 | Carley |
| 2002/0097823 A1 | 7/2002 | Kobayashi et al. |
| 2004/0022303 A1 | 2/2004 | Tonietto et al. |

OTHER PUBLICATIONS

Van Rhijn, A.J.; Lubking, G.W.; Haartsen, J.C.; "A fully silicon integrated SAW programmable transversal filter with programming/read-out circuitry," Proceedings of IEEE Ultrasonics Symposium, Dec. 8-11, 1991 pp. 89-94 vol. 1.*
PCT International Search Report and Written Opinion in counterpart International Application No. PCT/US06/16348, dated Nov. 16, 2007.

* cited by examiner

*Primary Examiner*—David C Payne
*Assistant Examiner*—Nader Bolourchi
(74) *Attorney, Agent, or Firm*—Edell, Shapiro & Finnan, LLC (57) ABSTRACT

A signal processing method and device are provided to perform an arbitrary signal processing or filtering function on a continuous time signal. An input continuous time signal is successively delayed by a plurality of delay elements to produce a plurality of delayed signals. A corresponding coefficient is applied to some or all of the plurality of delayed signals to produce a plurality of weighted signals. The plurality of weighted signals are combined to produce a processed output signal. The coefficients applied to some or all of the delayed signals are set to values so as to perform a desired signal filtering or processing function of the input continuous time signal in producing the processed output signal.

34 Claims, 10 Drawing Sheets

DENSE-TAP TRANSVERSAL FILTER WITH ELEMENTARY COEFFICIENTS

RELATED APPLICATION

This application claims priority to U.S. Application No. 60/677,356 filed May 4, 2005, the entirety of which is incorporated herein by reference.

BACKGROUND OF THE INVENTION

The present invention relates to circuits for filtering signals, and more particularly to a dense-tap transversal filter.

The theory of discrete-time filters is well known. See, for example, R. W. Hamming, "Digital Filters," Dover Publications, Inc., 3$^{rd}$ edition, 1989. In transversal structures, such as the conventional Finite Impulse Response (FIR) filter shown at reference numeral 10 in FIG. 1A, successive samples in time of the input signal to be filtered are converted to binary numbers by an analog-to-digital converter (ADC) 14 after passing through a sample-and-hold (S/H) circuit 12, stored in memory 16 and retrieved by a digital signal processor (DSP) 18 that multiplies the samples by coefficients appropriate to the filtering operation of interest and sums the products to effect the desired filter response.

Figure 1A:
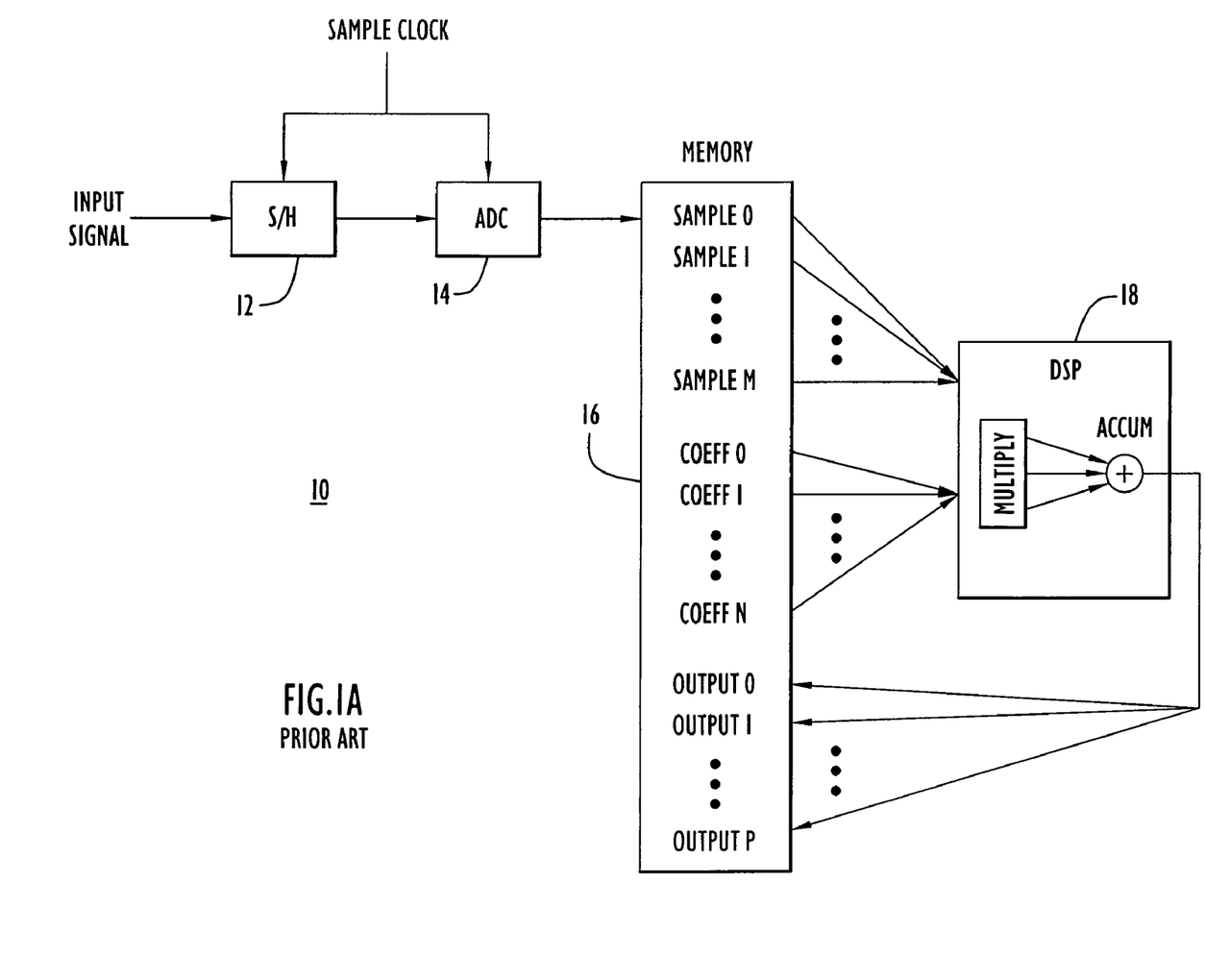
FIG. 1A is a block diagram of a prior art DSP-based Finite Impulse Response (FIR) transversal digital filter.

Filters of this general type have several properties, requirements and limitations. The sampling rate must be at least twice the bandwidth of the input signal. Therefore, input signals must first be band-limited and/or down-converted in frequency to make them amenable to low-cost, low-power ADCs for use in handheld, cost-sensitive consumer applications. The accuracy of the filter response depends upon the precision of the both the ADC 14 and the coefficients. An ADC producing 12-bit samples at 65-Msps (mega-samples per second) costs over $20 even in large quantities. This is cost prohibitive for consumer applications such as mobile phones and television set-top boxes.

Figure 1B:
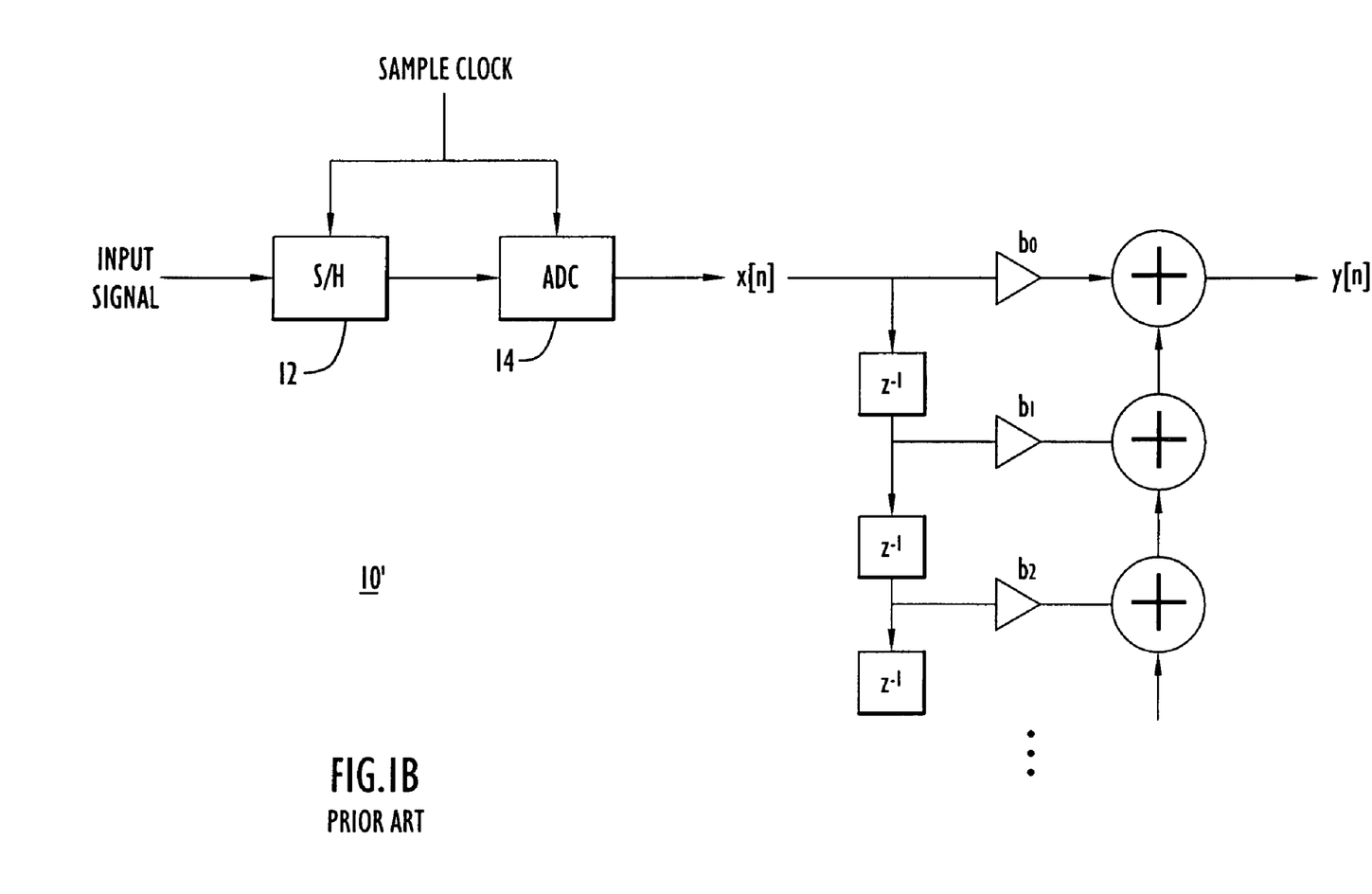
FIG. 1B is a block diagram showing an alternative representation of the FIR filter shown in FIG. 1A.

FIG. 1B illustrates an alternative representation 10' for the operation of the prior-art FIR filter shown in FIG. 1A. In this representation, the continuous time input signal is sampled at successive sample times by the S/H circuit 12 and the ADC 14 produces digitized sample values, $x_0, x_1, x_2 \ldots x_n$, which are stored in digital memory shown at 16 in FIG. 1B. At each sample time, the stored digitized sample values are multiplied by corresponding coefficient values, $b_0, b_1, b_2 \ldots b_m$. The products are summed to produce the digitized output value corresponding to that sample time. For example, at sample time $t_0$, the result is represented as:

$$y_0 = \sum_{i=0}^{n} x_i \times b_i = x_0 b_0 + x_1 b_1 + x_2 b_2 + \ldots + x_n b_n$$

After the calculation of $y_0$, the "old" digitized sample values are shifted in time by one sample time by re-assignment; thus, $x_0 \rightarrow x_1, x_1 \rightarrow x_2, x_2 \rightarrow x_3, \ldots, x_{n-1} \rightarrow x_n$. The "old" digitized sample $x_n$ is discarded, a "new" digitized sample value, $x_0$, is added, and a new digitized output value corresponding to the new sample time is produced by again summing the products of the "new" digitized sample values $x_i$ and the coefficients $b_i$. Considerable sampling, analog-to-digital conversion, digital storage and digital processing resources are required to implement the signal processing depicted in FIG. 1B. Further, if a continuous-time output signal is required, an additional digital-to-analog conversion must be performed to convert the digitized output values into analog form.

The filter coefficients comprise binary numbers of 16-bits to 32-bits. The DSP that performs the multiply-accumulate operations central to transversal digital filter operation may be required to operate at rates as high as several hundred MHz on stored binary numbers represented by as many as 32-bits. The binary numbers can themselves require considerable amounts of temporary storage in addition to the program memory for the DSP. Again, the cost of such high-speed circuits and memory may exceed what can be born by many cost-sensitive applications.

SUMMARY OF THE INVENTION

Briefly, a signal processing method and device are provided to perform an arbitrary signal processing or filtering function on an input continuous time signal. The input continuous time signal is successively delayed by a plurality of delay elements to produce a plurality of delayed signals. A corresponding coefficient is applied to some or all of the input and the plurality of delayed signals to produce a plurality of weighted signals. The plurality of weighted signals are combined to produce a processed output signal. The coefficients applied to some or all of the delayed signals are set to values so as to perform a desired signal processing or filtering function of the input continuous time signal in producing the processed output signal.

The above and other objects and advantages of this invention will become more readily apparent when reference is made to the following description taken in conjunction with the accompanying drawings.

DETAILED DESCRIPTION

Figure 2:
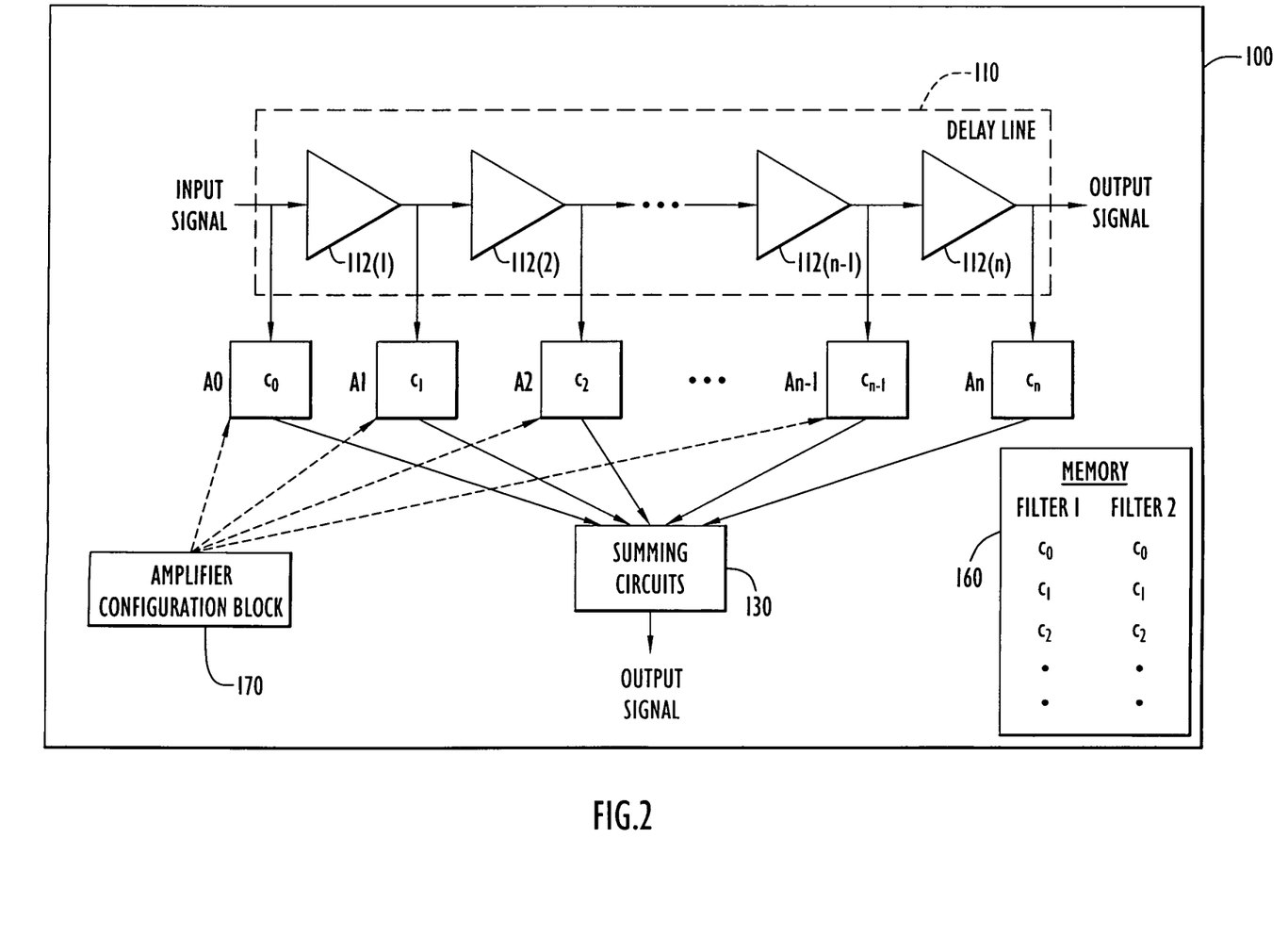
FIG. 2 is a block diagram of a dense-tap transversal filter using elementary circuit components according to one embodiment.

Referring to FIG. 2, a block diagram of a dense-tap transversal filter 100 according to one embodiment is shown. The filter 100 is capable of performing any, i.e., arbitrary, filtering operation on continuous time signals utilizing a transversal structure comprising a delay line 110, a plurality of amplifier circuits A0 to An and a summing circuit represented by reference numeral 130.

The delay line 110 comprises a plurality of delay elements 112(0) to 112(n) or buffers that may comprise active or passive electrical circuits. Each delay element 112(0) to 112(n) delays a signal at its input by an equal (i.e., the same) delay amount to produce a delayed copy of the signal at its output. Thus, the series of delay elements 112(0) to 112(n) of the delay line 110 delays the input signal to be filtered successively in equal delay amount increments so as to produce a plurality of delayed signals, each one delayed one delay amount increment more than at the output of the previous delay element in the series.

An example of an active buffer/delay circuit element is a single transistor amplifier configured as a non-inverting voltage follower or as an inverter. An example of a passive buffer/delay circuit element is a wire or transmission line. The delay elements 112(0) to 112(n) of the tapped delay line 110 each constitute a delay that corresponds to a fraction of the period (T) of the input signal to be filtered. For example, each delay element may impose a delay of 1% of the period of the input signal to be filtered. The total delay of the tapped delay line 110 should equal or exceed the period of the lowest frequency to be filtered.

Similarly, the amplifiers A0 to An may be single or multiple transistor amplifier circuits, and have corresponding configurable gain coefficients $c_0, c_1, \ldots, c_n$. The inputs to amplifiers A0 to An are coupled to, i.e., tap the output of a corresponding one of the delay elements 112(0) to 112(n). For example, in the embodiment of FIG. 2, amplifier A0 taps the output of delay element 112(0), amplifier A1 taps the output of delay element 112(1), and so on. Each amplifier A0 to An applies a corresponding one of the coefficient $c_0, c_1, \ldots, c_n$ to its corresponding input signal tapped from a corresponding one of the delay elements 112(o) to 112(n). These amplifier coefficients may also be referred to as tap coefficients. In one embodiment, tap coefficients are only one of three values: −1, 0 or +1. In addition, in one embodiment the delay amounts of the delay elements 112(0) to 112(n) are closely spaced in time with respect to a period of the input signal to be filtered.

In an exemplarily embodiment, each amplifier A0 to An may be a single transistor amplifier that is configurable with one or more switches to be in a voltage follower configuration (for a "+1" amplifier coefficient), an inverted voltage follower configuration (for a "−1" amplifier coefficient) and or an open circuit configuration (for a "0" amplifier coefficient). In this type of amplifier coefficient configuration {−1, 0 or +1}, the amplifiers A0 to An simply pass the input signal unchanged, invert it, or block it from being summed with the other products. Thus, generally speaking, some or all of the delayed signals from the delay elements are multiplied by a corresponding coefficient.

According to another embodiment, if active buffers are used for the delay elements, inverting and non-inverting amplifiers represent the sign of the respective coefficient amplifier values operating on the output of each buffer. If the active buffers themselves invert the input signal transferred to their corresponding tap, the sign of the respective coefficient amplifier must be inverted. Unity-gain coefficients are useful where ease of implementation is an overriding design factor. However, the present invention is not to be limited to unity-gain coefficient values. Other coefficient values (e.g., fractional, integer greater than 1, etc.) may be implemented depending on the particular filter application, design constraints, etc.

By applying the coefficients c0 to cn to the successively delayed version of the input continuous time signal, the amplifiers A0 to An produce a plurality of weighted signals. The summing circuit 130 combines the plurality of output (weighted) signals produced by the amplifiers A0 to An to produce a final or processed output signal. For example, the summing or adder circuit 130 may comprise a well-known operational amplifier configured to algebraically add the voltages or currents presented by joining the outputs of the amplifiers A0 to An at a common electrical point.

The filter 100 is configurable by programming the coefficients for the amplifiers A0 to An according to the filtering operation desired. In one embodiment, a memory 160 is provided that stores values for the amplifier coefficients $c_0, c_1, \ldots, c_n$. The memory 160 may store a set of amplifier coefficients for each of a plurality of filter operations as shown in FIG. 2. When the filter is to be configured, an amplifier configuration block 170 reads out from the memory 160 a corresponding set of amplifier coefficients and generates the appropriate configuration signals that are coupled to the amplifiers A0 to An to configure them. The amplifier configuration block 170 may be a dedicated digital circuit, or may consist of a software routine executed by processor of a host device in which the filter 100 resides. The amplifier coefficient values {−1, 0 or +1} may be represented in the memory 160 by 2-bit values. Thus, for a filter design that uses 1000 amplifiers (and delay elements), a 2k bit memory is sufficient to store the amplifier coefficient values.

Alternatively, the coefficients $c_0, c_1, \ldots, c_n$ may be fixed by connecting a tapped delay line element of the delay line 110 to a respective voltage level corresponding to an amplification operation by a factor of +1, 0 or −1.

According to still another alternative, the coefficients $c_0, c_1, \ldots, c_n$ may be fixed by connecting an inverting voltage follower, a non-inverting voltage follower or an open circuit to the tapped delay line as required to produce the plurality of weighted signals which, when combined, produce the desired filter response. Therefore, in this alternative, the switch 114 or selector (described below in conjunction with FIG. 3) would not be needed because the amplifier configuration is fixed.

Figure 3:
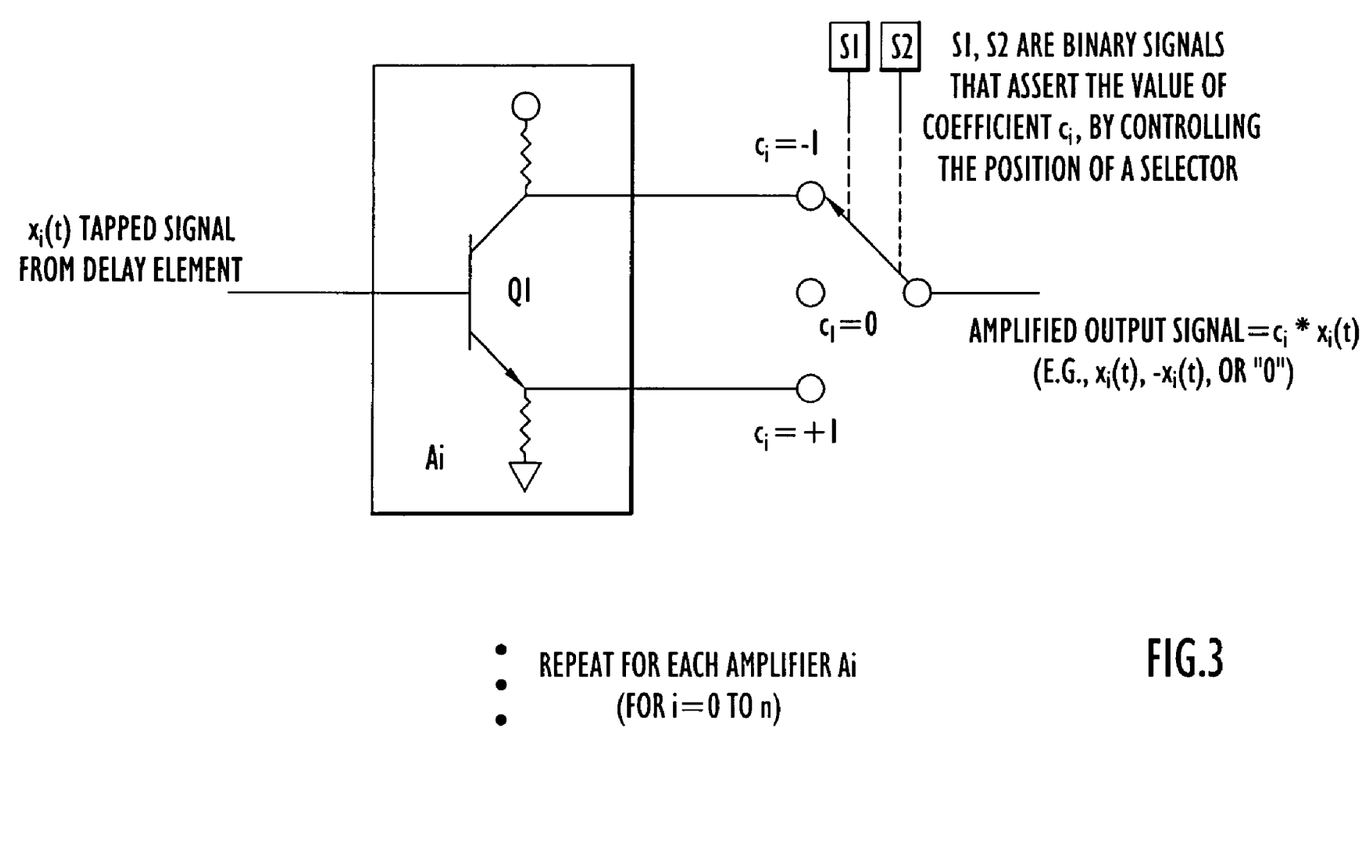
FIG. 3 is a circuit diagram of an amplifier and associated configuration circuitry according to one embodiment that is useful in the filter shown in the embodiment of FIG. 2.

Turning to FIG. 3, with continued reference to FIG. 2, an example of an amplifier Ai is shown according to one embodiment. The amplifier Ai is a transistor Q1. This amplifier structure is repeated for each of the plurality of amplifiers Ai, for i=0 to n. In this embodiment, there are two signals S1 and S2 that configure the transistor Q1 to be in a voltage follower configuration (for a "+1" coefficient), an inverting configuration (for a "−1" coefficient) or an open-circuit configuration (for a "0" coefficient). The signals S1 and S2 are responsive to amplifier configuration signals supplied by the amplifier configuration block 170. For example, the signals S1 and S2 are binary signals that assert the value of coefficient ci by controlling the position of a selector or switch 114.

Selection of the individual amplifier coefficients is made to achieve the desired filter response. Table 1 below contains an example of amplifier coefficients calculated using a first-order "Σ-Δ" method according to one embodiment. Each row in the table corresponds to one of the plurality of amplifiers A0 to An, wherein the values of the ideal impulse response are accumulated until the sum reaches a threshold which triggers the replacement of a 0 coefficient with either a +1 or a −1 coefficient, according to the sign of the accumulus. In this example, the ideal impulse response to be produced is $\sin(2\pi ft)/2\pi ft$, an impulse response known to minimize intersymbol interference in pulse-based communication channels. This is a filter response that cannot be realized with passive components (i.e., RLC networks) and is achieved today exclusively by means of much more costly digital filters.

Traditional "digital" filter implementations require sample-and-hold (S/H), analog-to-digital converter (ADC), memory to store binary samples of the analog signal to be filtered and digital-signal-processor (DSP) circuitry. By contrast, the filter 100 is built from simple analog circuits and achieves filter processing of continuous time signals that can operate at higher frequencies while occupying less silicon area and consuming less power than conventional digital filter implementation of comparable filter performance sophistication. The filter 100 is based on a programmable design and replaces the digital coefficient "multiplication" with simple (in fact "elementary") circuits that either pass the input signal unchanged, invert it, or block it from being summed with the other products. In addition, the filter 100 eliminates stored coefficient values for a fixed filter implementation and reduces the coefficient values to 2-bits (as an example) for a programmable design.

Figure 4:
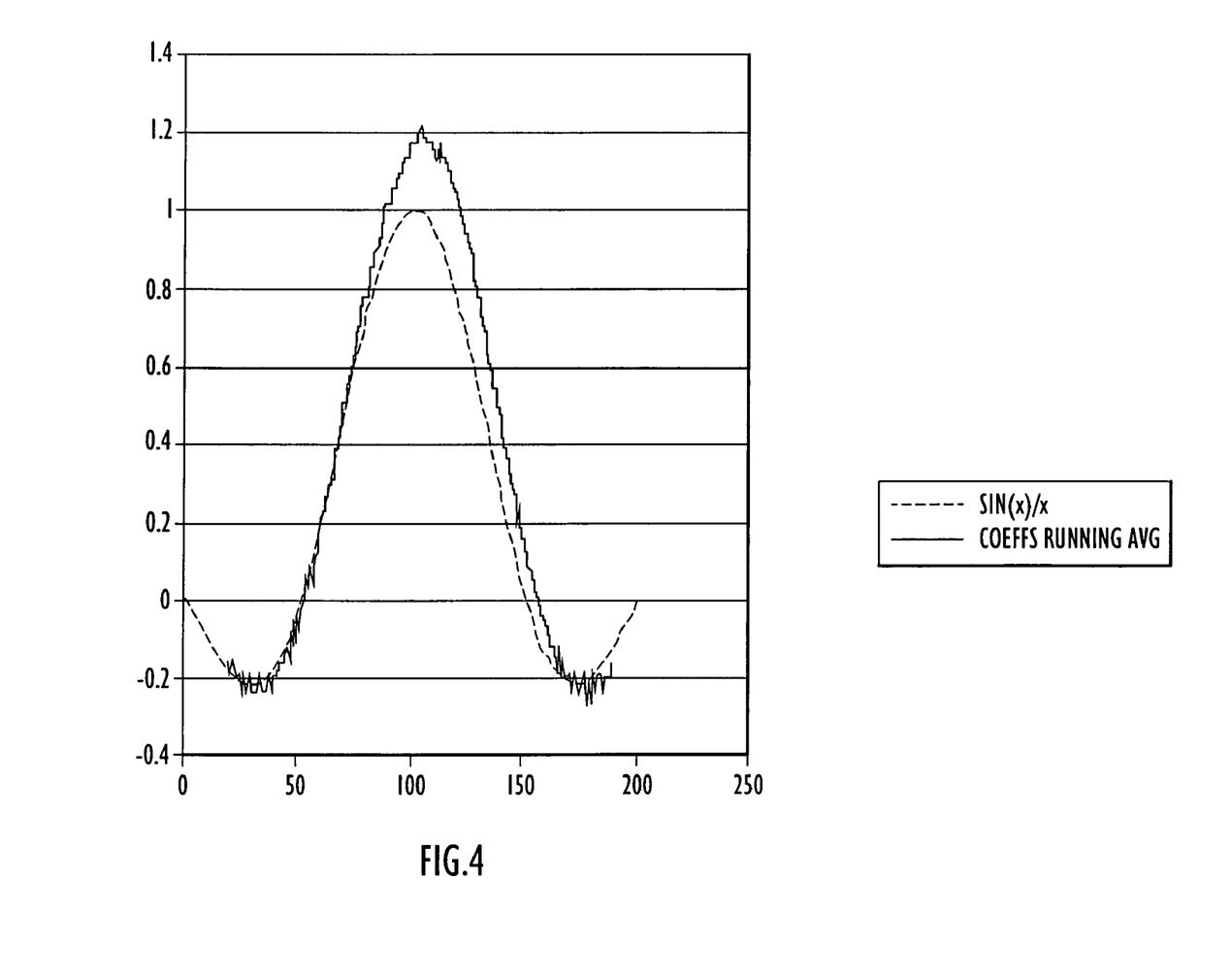
FIG. 4 is a diagram showing a plot for a running average of amplifier coefficients for a filtering function performed by a filter architecture shown in the embodiment of FIG. 2 compared with a plot of ideal coefficients for the filtering function.

Turning to FIG. 4, a comparison is shown between coefficients for an ideal filtering function ($\sin(x)/x$) and coefficients for the same filtering function using the filter 100 according to the embodiments described herein with the example coefficients, $c_i$, shown in Table 1. Comparison of the ideal ($\sin(x)/x$) coefficients with a 32-tap running average of the tabulated amplifier coefficients for a filter 100 indicates that the filter 100 closely approximates the ideal behavior. The performance with respect to the ideal filter can be improved by increasing the density of taps (increasing the number of delay elements and reducing the time delay for each delay element) and/or by employing finer-grained but still elementary coefficients $c_i$ and/or by employing a higher-order $\Sigma$-$\Delta$ algorithm or some other algorithm. Any known or hereinafter developed techniques for choosing the amplifier coefficients may be employed to derive amplifier coefficients for the filter 100.

It should be understood that the present invention is not limited to a system or method that uses 0, −1 and +1 as possible coefficient values. There are infinite numbers of other coefficient values that are possible without departing from the scope and spirit of the invention. As a further non-limiting example, the possible coefficient values may be {−2, −1.5, −1, −0.5, 0, 0.5, 1, 1.5, 2.0}. In general, the larger the set of possible coefficient values, a greater resolution or accuracy may be achieved for a particular signal processing or filtering function with respect to the ideal behavior.

Figure 5:
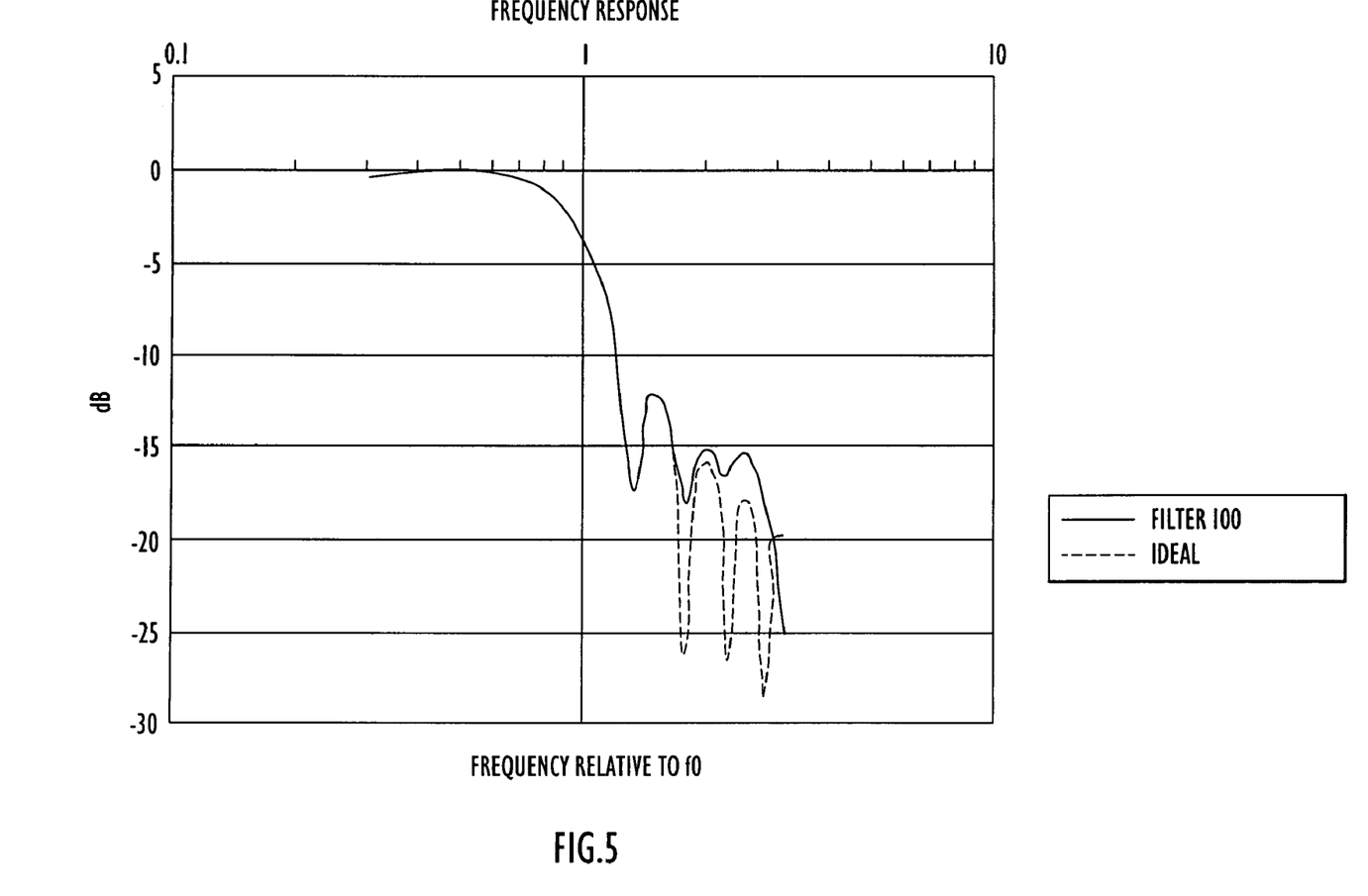
FIG. 5 is a diagram showing a plot comparing the frequency response for a filter function performed by a filter architecture using the filter coefficients shown in FIG. 4 compared with a plot for the filter function performed by an ideal filter.

FIG. 5 illustrates a comparison of the frequency responses of the ideal filter and filter 100 for the coefficients represented by FIG. 4. Again, the frequency response performance of the filter 100 implementing a ($\sin(x)/x$) filter function is comparable to the ideal filter. The responses of the filter 100 and the ideal may deviate as the frequency increases and the tap spacing represents a larger fraction of the period of the input signal. This disagreement may be tolerated for some applications, or reducing the delay of each tap and increasing the number of taps can improve it, as can increasing the resolution of the coefficients.

Figure 6:
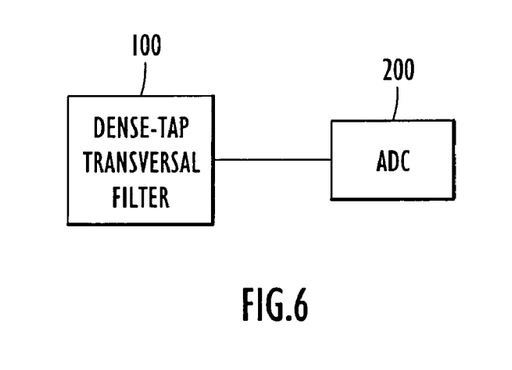
FIGS. 6 and 7 are block diagrams showing exemplary applications of the dense-tap transversal filter according to embodiments of the present invention.
Figure 7:
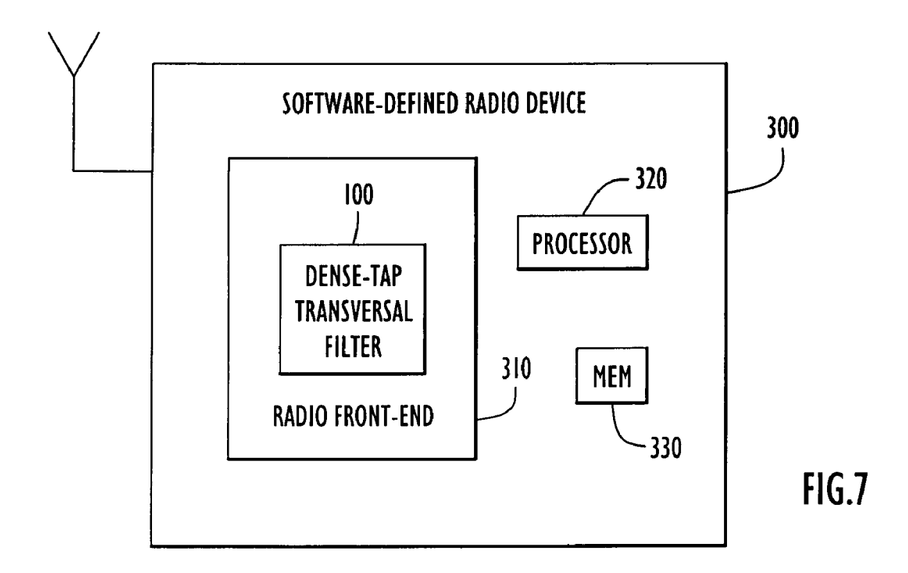

The filter 100 can be used for any analog or continuous time signal filtering operation. FIGS. 6 and 7 illustrate examples of applications. In FIG. 6, the filter 100 is used as a front-end anti-aliasing (band limiting) filter to an analog-to-digital converter (ADC) 200 according to one embodiment. The processed output signal of the filter 100 is coupled as an input to the ADC 200 and the amplifier coefficients are set to values that reduce a bandwidth of the input continuous time signal prior to it being converted to a digital signal. In this application, the filter 100 can significantly reduce the bandwidth of the analog signal to be converted, and in so doing, allows for decimating the samples, thereby making subsequent processing of the digital signal simpler.

FIG. 7 illustrates use of the filter 100 in a software-defined radio device 300 according to one embodiment. In this application, the filter 100 is included in a radio front-end section 310. There is an onboard processor 320, such as a microprocessor or microcontroller. The filter 100 is configurable to provide several different filter functions or filtering characteristics depending on the type if signal that the radio device is processing. For example, a software-defined radio device may be a multiple mode device that is capable of processing signals according to multiple wired or wireless communication standards/protocols. Amplifier coefficients for the filter 100 are stored in the a memory 330 associated with the processor 320 for each of the plurality of filter functions to be performed by the filter 100, and the filter 100 is reconfigured each time a different filtering function is needed.

Figure 8:
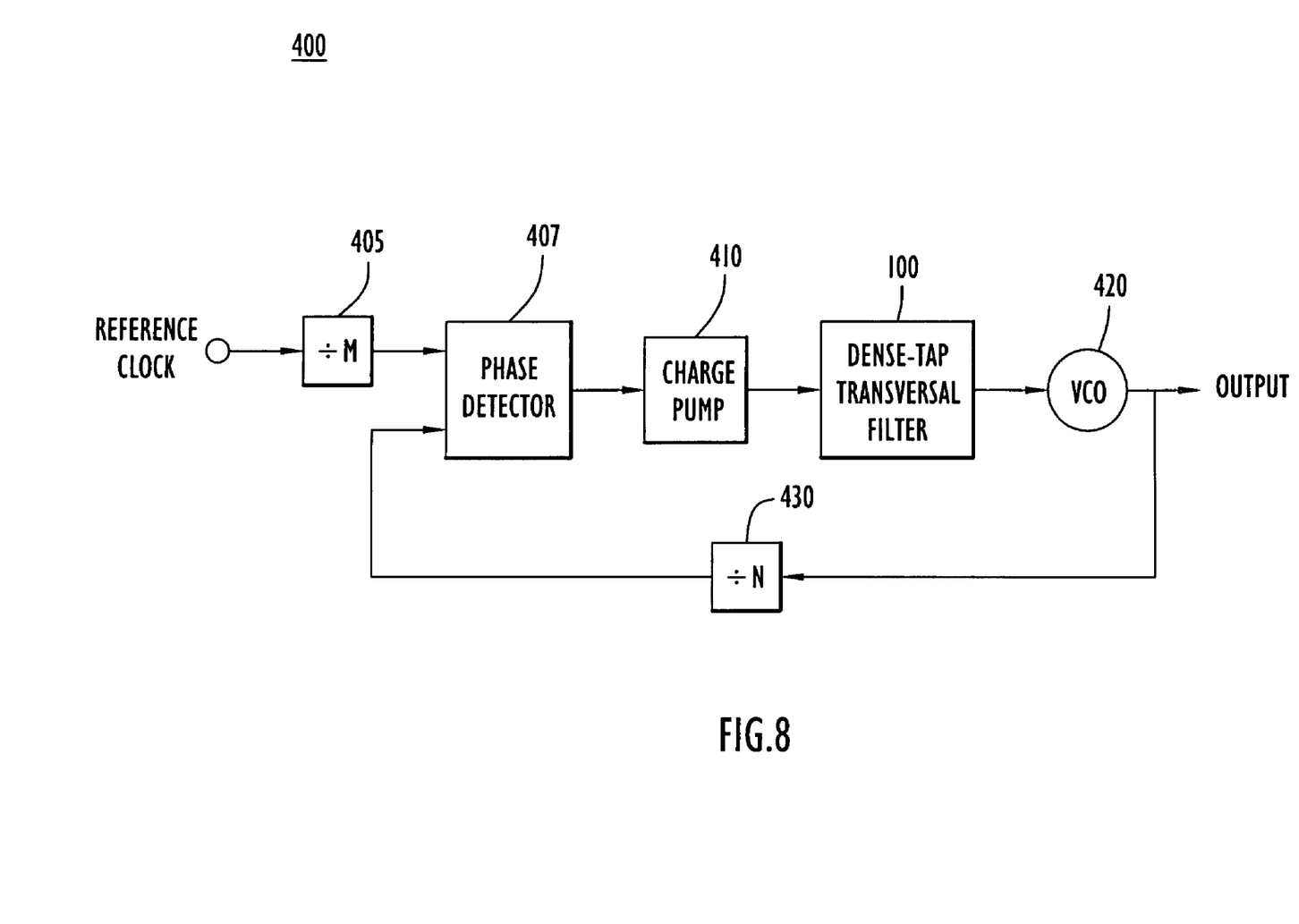
FIG. 8 is a block diagram of a phase-locked loop incorporating a dense-tap transversal filter according to an embodiment of the invention.

FIG. 8 illustrates the use of the filter 100 in a phase-locked loop device 400 according to one embodiment. In this application, the filter 100 is included between a charge pump and the voltage-controlled oscillator (VCO). A reference clock is supplied as input to a first divider 405 that divides the reference clock by a first divisor value M and outputs a signal to a first input of a phase detector 407. The output of the VCO 420 is coupled to a second divider 430 that divides the VCO output by a second divisor value N and the output of the second divider 430 is connected to a second input of the phase detector 407. The output of the phase detector 407 is coupled to the input of the charge pump 410. The charge pump 410 outputs a continuous time signal representative of the phase difference between the output of the VCO 420 (divided by N) and the reference clock signal (divided by M). The passband of the filter 100 is configurable to allow for a wide variety of tradeoffs between frequency-setting resolution, frequency-changing responsiveness and output spectral purity.

Figure 9:
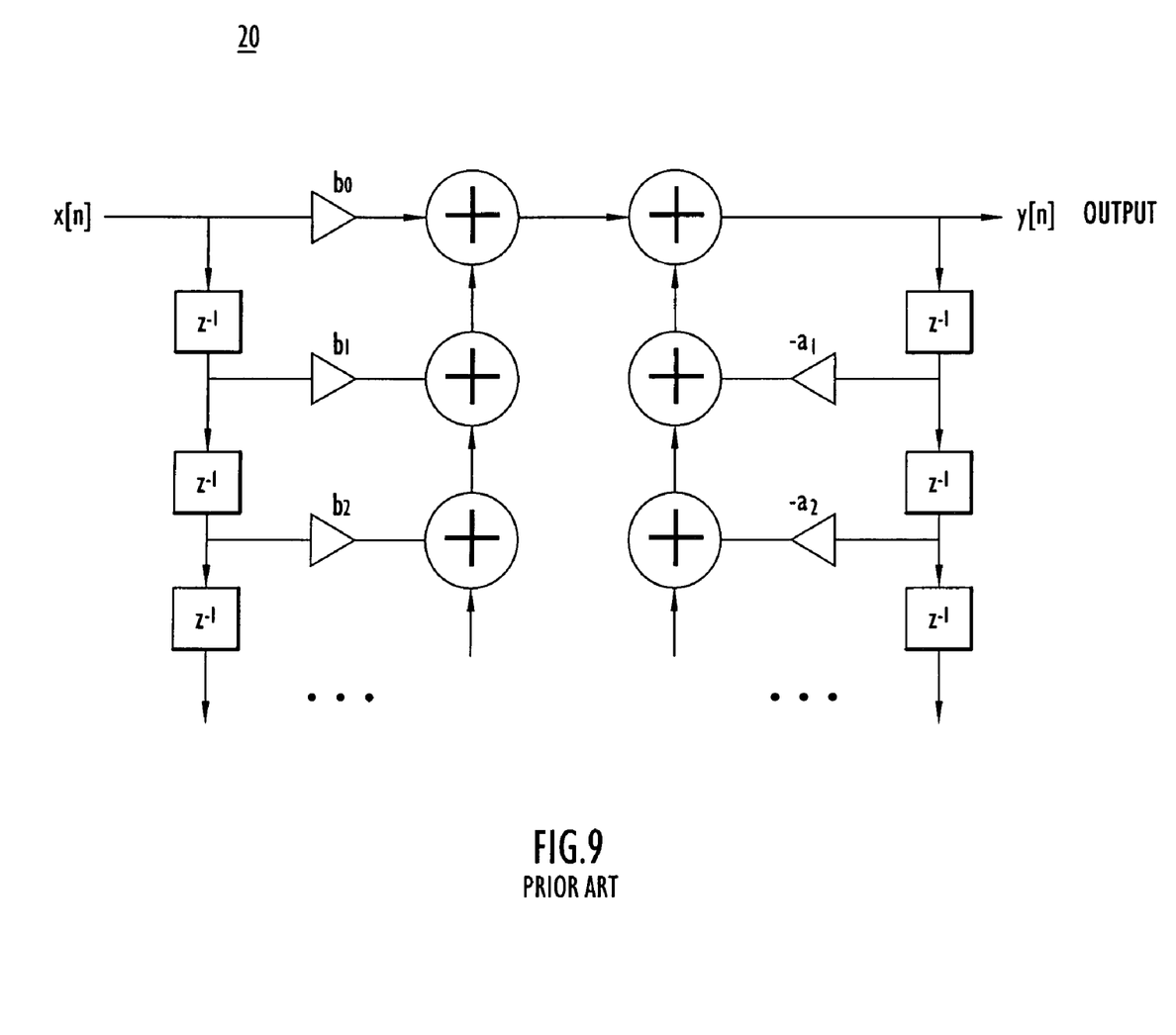
FIG. 9 is a block diagram of a prior art Infinite Impulse Response (IIR) filter.

FIG. 9 illustrates a representation of a prior art Infinite Impulse Response (IIR) filter 20. The topology of the IIR filter 20 may be considered to comprise two prior-art FIR filters of the type shown in FIG. 1B, wherein the output of the first FIR filter is combined at the summation point of the second FIR filter and the input to the second FIR filter is the output of the IIR filter.

Figure 10:
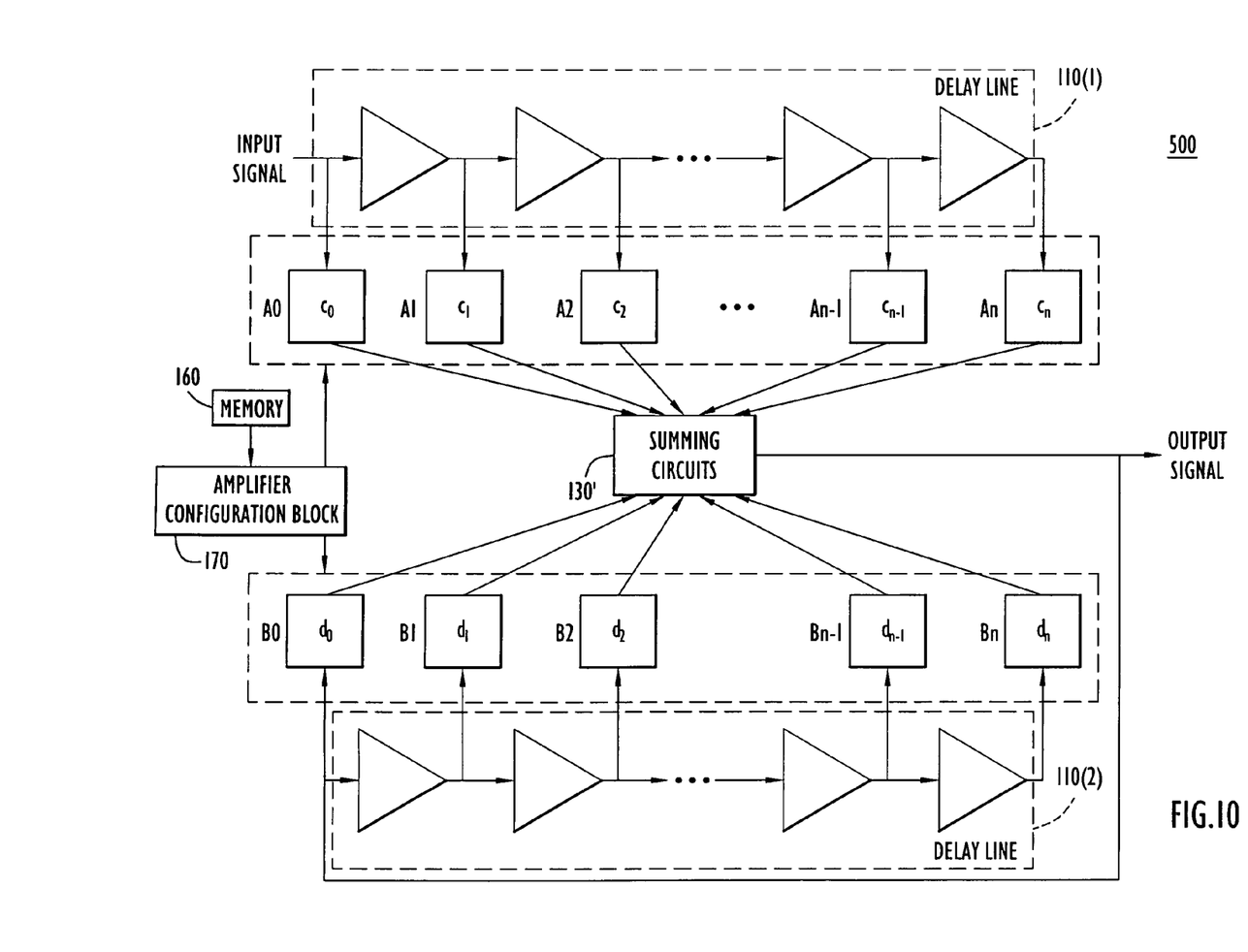
FIG. 10 is a block diagram of an IIR filter incorporating dense-tap transversal filters according to an embodiment of the invention.

FIG. 10 illustrates an embodiment of an IIR filter 500 by combining two instances of the dense tap transversal filter 100 shown in the embodiment of FIG. 2. There is a first delay line 110(1) having connected thereto a block of amplifiers A0 to An with corresponding coefficients $c_0, c_1, \ldots, c_n$ and a second delay line 110(2) having connected thereto a block of amplifiers A0 to An with corresponding coefficients $d_0, d_1, \ldots, d_n$ that generally are different from the coefficients $c_0, c_1, \ldots, c_n$. The outputs of the block of amplifiers A0 to An and the outputs of the block of amplifiers B0 to Bn are connected to a summing circuit block 130'. The summing circuit block 130' comprises summing circuits that combine all of the amplifier (voltage or current) outputs. The output of the summing circuit block 130' corresponds to the output of the IIR filter 500. The output of the summing circuit 130' is also coupled back as an input to the second delay line 110(2). The coefficients for the amplifier blocks A0 to An and B0 to Bn are stored in the memory 160 and the amplifier configuration block 170 configures the amplifier blocks A0 to An and B0 to Bn to program the characteristics of the IIR filter 500.

TABLE 1

Example amplifier coefficients

| t | $x = 2\pi f_0 t$ | $\sin(x)/x$ | coefficients | $\sin(x)/x$ − coefficient | accumulated differences |
|---|---|---|---|---|---|
| −0.00101 | −6.34602 | 0.009894 | 0 | 0.009894477 | 0.009894477 |
| −0.001 | −6.28319 | 1.94E−15 | 0 | 1.94001E−15 | 0.009894477 |
| −0.00099 | −6.22035 | −0.01009 | 0 | −0.010094365 | −0.000199888 |
| −0.00098 | −6.15752 | −0.02035 | 0 | −0.020354494 | −0.020554382 |
| −0.00097 | −6.09469 | −0.03075 | 0 | −0.030745013 | −0.051299395 |
| −0.00096 | −6.03186 | −0.04123 | 0 | −0.041229401 | −0.092528796 |
| −0.00095 | −5.96903 | −0.05177 | 0 | −0.051770086 | −0.144298882 |
| −0.00094 | −5.90619 | −0.06233 | 0 | −0.062328556 | −0.206627438 |
| −0.00093 | −5.84336 | −0.07287 | −1 | 0.927134539 | 0.720507101 |
| −0.00092 | −5.78053 | −0.08334 | 1 | −1.083340738 | −0.362833637 |
| −0.00091 | −5.7177 | −0.09371 | −1 | 0.906286282 | 0.543452646 |
| −0.0009 | −5.65487 | −0.10394 | 1 | −1.103943254 | −0.560490608 |
| −0.00089 | −5.59203 | −0.11399 | −1 | 0.886012159 | 0.325521551 |
| −0.00088 | −5.5292 | −0.12381 | 0 | −0.123805745 | 0.201715806 |
| −0.00087 | −5.46637 | −0.13336 | 0 | −0.133355127 | 0.068360679 |
| −0.00086 | −5.40354 | −0.14259 | 0 | −0.142594176 | −0.074233497 |
| −0.00085 | −5.34071 | −0.15148 | 0 | −0.15148124 | −0.225714737 |
| −0.00084 | −5.27788 | −0.15997 | −1 | 0.840025044 | 0.614310307 |
| −0.00083 | −5.21504 | −0.16803 | 1 | −1.168034385 | −0.553724078 |
| −0.00082 | −5.15221 | −0.17562 | −1 | 0.824380856 | 0.270656778 |
| −0.00081 | −5.08938 | −0.18269 | 0 | −0.182689535 | 0.087967243 |
| −0.0008 | −5.02655 | −0.18921 | 0 | −0.189206682 | −0.10123944 |
| −0.00079 | −4.96372 | −0.19513 | −1 | 0.804867344 | 0.703627905 |
| −0.00078 | −4.90088 | −0.20043 | 1 | −1.200430604 | −0.4968027 |
| −0.00077 | −4.83805 | −0.20506 | −1 | 0.794935118 | 0.298132419 |
| −0.00076 | −4.77522 | −0.209 | 0 | −0.209001167 | 0.089131251 |
| −0.00075 | −4.71239 | −0.21221 | 0 | −0.212206591 | −0.123075339 |
| −0.00074 | −4.64956 | −0.21465 | −1 | 0.785350152 | 0.662274813 |
| −0.00073 | −4.58673 | −0.2163 | 1 | −1.216301313 | −0.5540265 |
| −0.00072 | −4.52389 | −0.21713 | −1 | 0.782866845 | 0.228840345 |
| −0.00071 | −4.46106 | −0.21712 | 0 | −0.217119434 | 0.011720911 |
| −0.0007 | −4.39823 | −0.21624 | 0 | −0.216236208 | −0.204515297 |
| −0.00069 | −4.3354 | −0.21446 | −1 | 0.785538371 | 0.581023074 |
| −0.00068 | −4.27257 | −0.21178 | 1 | −1.211776027 | −0.630752952 |
| −0.00067 | −4.20973 | −0.20816 | −1 | 0.791838 | 0.161085048 |
| −0.00066 | −4.1469 | −0.2036 | 0 | −0.203604489 | −0.042519441 |
| −0.00065 | −4.08407 | −0.19809 | 0 | −0.198090852 | −0.240610293 |
| −0.00064 | −4.02124 | −0.19161 | −1 | 0.808389076 | 0.567778783 |
| −0.00063 | −3.95841 | −0.18416 | 1 | −1.18415708 | −0.616378297 |
| −0.00062 | −3.89557 | −0.17572 | −1 | 0.824275717 | 0.20789742 |
| −0.00061 | −3.83274 | −0.16631 | 0 | −0.166310129 | 0.041587291 |
| −0.0006 | −3.76991 | −0.15591 | 0 | −0.155914881 | −0.11432759 |
| −0.00059 | −3.70708 | −0.14454 | −1 | 0.855458503 | 0.741130913 |
| −0.00058 | −3.64425 | −0.1322 | 1 | −1.132195653 | −0.391064739 |
| −0.00057 | −3.58142 | −0.11889 | −1 | 0.881114248 | 0.490049508 |
| −0.00056 | −3.51858 | −0.10462 | 1 | −1.104622933 | −0.614573425 |
| −0.00055 | −3.45575 | −0.08942 | −1 | 0.910578942 | 0.296005517 |
| −0.00054 | −3.39292 | −0.0733 | 0 | −0.073296713 | 0.222708804 |
| −0.00053 | −3.33009 | −0.05627 | 0 | −0.056269174 | 0.16643963 |
| −0.00052 | −3.26726 | −0.03836 | 0 | −0.038360392 | 0.128079238 |
| −0.00051 | −3.20442 | −0.01959 | 0 | −0.019594944 | 0.108484294 |
| −0.0005 | −3.14159 | −1.2E−15 | 0 | −1.23322E−15 | 0.108484294 |
| −0.00049 | −3.07876 | 0.020395 | 0 | 0.020394738 | 0.128879032 |
| −0.00048 | −3.01593 | 0.041557 | 0 | 0.041557091 | 0.170436123 |
| −0.00047 | −2.9531 | 0.063452 | 0 | 0.063452473 | 0.233888596 |
| −0.00046 | −2.89027 | 0.086044 | 1 | −0.913956033 | −0.680067437 |
| −0.00045 | −2.82743 | 0.109292 | −1 | 1.109292405 | 0.429224968 |
| −0.00044 | −2.7646 | 0.133156 | 1 | −0.86684354 | −0.437618572 |
| −0.00043 | −2.70177 | 0.157593 | −1 | 1.157592742 | 0.719974169 |
| −0.00042 | −2.63894 | 0.182556 | 1 | −0.817444099 | −0.097469929 |
| −0.00041 | −2.57611 | 0.207999 | 0 | 0.207998739 | 0.11052881 |
| −0.0004 | −2.51327 | 0.233872 | 1 | −0.766127679 | −0.655598869 |
| −0.00039 | −2.45044 | 0.260126 | −1 | 1.2601261 | 0.60452723 |
| −0.00038 | −2.38761 | 0.286708 | 1 | −0.713291959 | −0.108764728 |
| −0.00037 | −2.32478 | 0.313565 | 0 | 0.313564758 | 0.204800029 |
| −0.00036 | −2.26195 | 0.340642 | 1 | −0.659358357 | −0.454558328 |
| −0.00035 | −2.19911 | 0.367883 | 0 | 0.367883011 | −0.086675317 |
| −0.00034 | −2.13628 | 0.395232 | 1 | −0.604767756 | −0.691443074 |
| −0.00033 | −2.07345 | 0.422632 | −1 | 1.422631939 | 0.731188865 |
| −0.00032 | −2.01062 | 0.450024 | 1 | −0.549975944 | 0.181212922 |
| −0.00031 | −1.94779 | 0.47735 | 1 | −0.522649924 | −0.341437002 |
| −0.0003 | −1.88496 | 0.504551 | 0 | 0.504551152 | 0.163114151 |
| −0.00029 | −1.82212 | 0.531568 | 1 | −0.468431731 | −0.305317581 |
| −0.00028 | −1.75929 | 0.558342 | 1 | −0.441657602 | −0.746975183 |

TABLE 1-continued

Example amplifier coefficients

| t | $x = 2\pi f_0 t$ | $\sin(x)/x$ | coefficients | $\sin(x)/x$ − coefficient | accumulated differences |
|---|---|---|---|---|---|
| −0.00027 | −1.69646 | 0.584815 | 0 | 0.584814662 | −0.16216052 |
| −0.00026 | −1.63363 | 0.610926 | 1 | −0.389073511 | −0.551234031 |
| −0.00025 | −1.5708 | 0.63662 | 0 | 0.636619772 | 0.085385741 |
| −0.00024 | −1.50796 | 0.661837 | 1 | −0.33816297 | −0.252777229 |
| −0.00023 | −1.44513 | 0.686522 | 1 | −0.31347844 | −0.566255669 |
| −0.00022 | −1.3823 | 0.710618 | 0 | 0.710617598 | 0.144361929 |
| −0.00021 | −1.31947 | 0.73407 | 1 | −0.265929534 | −0.121567605 |
| −0.0002 | −1.25664 | 0.756827 | 1 | −0.243173271 | −0.364740876 |
| −0.00019 | −1.19381 | 0.778834 | 1 | −0.221165665 | −0.585906541 |
| −0.00018 | −1.13097 | 0.800043 | 0 | 0.800042767 | 0.214136226 |
| −0.00017 | −1.06814 | 0.820403 | 1 | −0.179596825 | 0.034539401 |
| −0.00016 | −1.00531 | 0.839869 | 1 | −0.160131482 | −0.125592081 |
| −0.00015 | −0.94248 | 0.858394 | 1 | −0.141606309 | −0.267198389 |
| −0.00014 | −0.87965 | 0.875936 | 1 | −0.124064348 | −0.391262737 |
| −0.00013 | −0.81681 | 0.892454 | 1 | −0.107546458 | −0.498809196 |
| −0.00012 | −0.75398 | 0.907909 | 1 | −0.092091203 | −0.590900398 |
| −0.00011 | −0.69115 | 0.922265 | 1 | −0.077734738 | −0.668635136 |
| −0.0001 | −0.62832 | 0.935489 | 1 | −0.064510716 | −0.733145852 |
| −0.00009 | −0.56549 | 0.94755 | 0 | 0.947549812 | 0.214403959 |
| −0.00008 | −0.50265 | 0.958418 | 1 | −0.041581518 | 0.172822442 |
| −0.00007 | −0.43982 | 0.96807 | 1 | −0.031930301 | 0.140892141 |
| −0.00006 | −0.37699 | 0.976481 | 1 | −0.023519296 | 0.117372844 |
| −0.00005 | −0.31416 | 0.983632 | 1 | −0.016368357 | 0.101004487 |
| −0.00004 | −0.25133 | 0.989506 | 1 | −0.010494379 | 0.090510108 |
| −0.00003 | −0.1885 | 0.994089 | 1 | −0.005911251 | 0.084598857 |
| −0.00002 | −0.12566 | 0.99737 | 1 | −0.002629817 | 0.08196904 |
| −0.00001 | −0.06283 | 0.999342 | 1 | −0.000657844 | 0.081311196 |
| 0 | 0 | 1 | 1 | 0 | 0.081311196 |
| 0.00001 | 0.062832 | 0.999342 | 1 | −0.000657844 | 0.080653352 |
| 0.00002 | 0.125664 | 0.99737 | 1 | −0.002629817 | 0.078023535 |
| 0.00003 | 0.188496 | 0.994089 | 1 | −0.005911251 | 0.072112284 |
| 0.00004 | 0.251327 | 0.989506 | 1 | −0.010494379 | 0.061617905 |
| 0.00005 | 0.314159 | 0.983632 | 1 | −0.016368357 | 0.045249548 |
| 0.00006 | 0.376991 | 0.976481 | 1 | −0.023519296 | 0.021730252 |
| 0.00007 | 0.439823 | 0.96807 | 1 | −0.031930301 | −0.010200049 |
| 0.00008 | 0.502655 | 0.958418 | 1 | −0.041581518 | −0.051781567 |
| 0.00009 | 0.565487 | 0.94755 | 1 | −0.052450188 | −0.104231755 |
| 0.0001 | 0.628319 | 0.935489 | 1 | −0.064510716 | −0.168742472 |
| 0.00011 | 0.69115 | 0.922265 | 1 | −0.077734738 | −0.24647721 |
| 0.00012 | 0.753982 | 0.907909 | 1 | −0.092091203 | −0.338568412 |
| 0.00013 | 0.816814 | 0.892454 | 1 | −0.107546458 | −0.446114871 |
| 0.00014 | 0.879646 | 0.875936 | 1 | −0.124064348 | −0.570179218 |
| 0.00015 | 0.942478 | 0.858394 | 1 | −0.141606309 | −0.711785527 |
| 0.00016 | 1.00531 | 0.839869 | 0 | 0.839868518 | 0.128082991 |
| 0.00017 | 1.068142 | 0.820403 | 1 | −0.179596825 | −0.051513833 |
| 0.00018 | 1.130973 | 0.800043 | 1 | −0.199957233 | −0.251471067 |
| 0.00019 | 1.193805 | 0.778834 | 1 | −0.221165665 | −0.472636731 |
| 0.0002 | 1.256637 | 0.756827 | 1 | −0.243173271 | −0.715810003 |
| 0.00021 | 1.319469 | 0.73407 | 0 | 0.734070466 | 0.018260464 |
| 0.00022 | 1.382301 | 0.710618 | 1 | −0.289382402 | −0.271121939 |
| 0.00023 | 1.445133 | 0.686522 | 1 | −0.31347844 | −0.584600379 |
| 0.00024 | 1.507964 | 0.661837 | 0 | 0.66183703 | 0.077236651 |
| 0.00025 | 1.570796 | 0.63662 | 1 | −0.363380228 | −0.286143576 |
| 0.00026 | 1.633628 | 0.610926 | 1 | −0.389073511 | −0.675217087 |
| 0.00027 | 1.69646 | 0.584815 | 0 | 0.584814662 | −0.090402425 |
| 0.00028 | 1.759292 | 0.558342 | 1 | −0.441657602 | −0.532060027 |
| 0.00029 | 1.822124 | 0.531568 | 0 | 0.531568269 | −0.000491758 |
| 0.0003 | 1.884956 | 0.504551 | 1 | −0.495448848 | −0.495940606 |
| 0.00031 | 1.947787 | 0.47735 | 0 | 0.477350076 | −0.018590529 |
| 0.00032 | 2.010619 | 0.450024 | 1 | −0.549975944 | −0.568566473 |
| 0.00033 | 2.073451 | 0.422632 | 0 | 0.422631939 | −0.145934534 |
| 0.00034 | 2.136283 | 0.395232 | 0 | 0.395232244 | 0.24929771 |
| 0.00035 | 2.199115 | 0.367883 | 1 | −0.632116989 | −0.38281928 |
| 0.00036 | 2.261947 | 0.340642 | 0 | 0.340641643 | −0.042177637 |
| 0.00037 | 2.324779 | 0.313565 | 1 | −0.686435242 | −0.728612879 |
| 0.00038 | 2.38761 | 0.286708 | −1 | 1.286708041 | 0.558095162 |
| 0.00039 | 2.450442 | 0.260126 | 1 | −0.7398739 | −0.181778739 |
| 0.0004 | 2.513274 | 0.233872 | 0 | 0.233872321 | 0.052093582 |
| 0.00041 | 2.576106 | 0.207999 | 1 | −0.792001261 | −0.739907678 |
| 0.00042 | 2.638938 | 0.182556 | −1 | 1.182555901 | 0.442648223 |
| 0.00043 | 2.70177 | 0.157593 | 1 | −0.842407258 | −0.399759035 |
| 0.00044 | 2.764602 | 0.133156 | −1 | 1.13315646 | 0.733397424 |
| 0.00045 | 2.827433 | 0.109292 | 1 | −0.890707595 | −0.157310171 |
| 0.00046 | 2.890265 | 0.086044 | 0 | 0.086043967 | −0.071266204 |

TABLE 1-continued

Example amplifier coefficients

| t | $x = 2\pi f_0 t$ | $\sin(x)/x$ | coefficients | $\sin(x)/x$ − coefficient | accumulated differences |
|---|---|---|---|---|---|
| 0.00047 | 2.953097 | 0.063452 | 0 | 0.063452473 | −0.007813731 |
| 0.00048 | 3.015929 | 0.041557 | 0 | 0.041557091 | 0.03374336 |
| 0.00049 | 3.078761 | 0.020395 | 0 | 0.020394738 | 0.054138098 |
| 0.0005 | 3.141593 | −1.2E−15 | 0 | −1.23322E−15 | 0.054138098 |
| 0.00051 | 3.204425 | −0.01959 | 0 | −0.019594944 | 0.034543154 |
| 0.00052 | 3.267256 | −0.03836 | 0 | −0.038360392 | −0.003817238 |
| 0.00053 | 3.330088 | −0.05627 | 0 | −0.056269174 | −0.060086412 |
| 0.00054 | 3.39292 | −0.0733 | 0 | −0.073296713 | −0.133383125 |
| 0.00055 | 3.455752 | −0.08942 | 0 | −0.089421058 | −0.222804183 |
| 0.00056 | 3.518584 | −0.10462 | −1 | 0.895377067 | 0.672572884 |
| 0.00057 | 3.581416 | −0.11889 | 1 | −1.118885752 | −0.446312868 |
| 0.00058 | 3.644247 | −0.1322 | −1 | 0.867804347 | 0.421491479 |
| 0.00059 | 3.707079 | −0.14454 | 1 | −1.144541497 | −0.723050018 |
| 0.0006 | 3.769911 | −0.15591 | −1 | 0.844085119 | 0.121035102 |
| 0.00061 | 3.832743 | −0.16631 | 0 | −0.166310129 | −0.045275028 |
| 0.00062 | 3.895575 | −0.17572 | 0 | −0.175724283 | −0.220999311 |
| 0.00063 | 3.958407 | −0.18416 | −1 | 0.81584292 | 0.594843609 |
| 0.00064 | 4.021239 | −0.19161 | 1 | −1.191610924 | −0.596767315 |
| 0.00065 | 4.08407 | −0.19809 | −1 | 0.801909148 | 0.205141833 |
| 0.00066 | 4.146902 | −0.2036 | 0 | −0.203604489 | 0.001537344 |
| 0.00067 | 4.209734 | −0.20816 | 0 | −0.208162 | −0.206624656 |
| 0.00068 | 4.272566 | −0.21178 | −1 | 0.788223973 | 0.581599318 |
| 0.00069 | 4.335398 | −0.21446 | 1 | −1.214461629 | −0.632862311 |
| 0.0007 | 4.39823 | −0.21624 | −1 | 0.783763792 | 0.150901481 |
| 0.00071 | 4.461062 | −0.21712 | 0 | −0.217119434 | −0.066217953 |
| 0.00072 | 4.523893 | −0.21713 | −1 | 0.782866845 | 0.716648893 |
| 0.00073 | 4.586725 | −0.2163 | 1 | −1.216301313 | −0.499652421 |
| 0.00074 | 4.649557 | −0.21465 | −1 | 0.785350152 | 0.285697732 |
| 0.00075 | 4.712389 | −0.21221 | 0 | −0.212206591 | 0.073491141 |
| 0.00076 | 4.775221 | −0.209 | 0 | −0.209001167 | −0.135510027 |
| 0.00077 | 4.838053 | −0.20506 | −1 | 0.794935118 | 0.659425092 |
| 0.00078 | 4.900885 | −0.20043 | 1 | −1.200430604 | −0.541005513 |
| 0.00079 | 4.963716 | −0.19513 | −1 | 0.804867344 | 0.263861832 |
| 0.0008 | 5.026548 | −0.18921 | 0 | −0.189206682 | 0.07465515 |
| 0.00081 | 5.08938 | −0.18269 | 0 | −0.182689535 | −0.108034386 |
| 0.00082 | 5.152212 | −0.17562 | −1 | 0.824380856 | 0.71634647 |
| 0.00083 | 5.215044 | −0.16803 | 1 | −1.168034385 | −0.451687915 |
| 0.00084 | 5.277876 | −0.15997 | −1 | 0.840025044 | 0.388337129 |
| 0.00085 | 5.340708 | −0.15148 | 0 | −0.15148124 | 0.236855889 |
| 0.00086 | 5.403539 | −0.14259 | 0 | −0.142594176 | 0.094261714 |
| 0.00087 | 5.466371 | −0.13336 | 0 | −0.133355127 | −0.039093413 |
| 0.00088 | 5.529203 | −0.12381 | 0 | −0.123805745 | −0.162899158 |
| 0.00089 | 5.592035 | −0.11399 | −1 | 0.886012159 | 0.723113 |
| 0.0009 | 5.654867 | −0.10394 | 1 | −1.103943254 | −0.380830254 |
| 0.00091 | 5.717699 | −0.09371 | −1 | 0.906286282 | 0.525456029 |
| 0.00092 | 5.78053 | −0.08334 | 1 | −1.083340738 | −0.557884709 |
| 0.00093 | 5.843362 | −0.07287 | −1 | 0.927134539 | 0.36924983 |
| 0.00094 | 5.906194 | −0.06233 | 1 | −1.062328556 | −0.693078726 |
| 0.00095 | 5.969026 | −0.05177 | −1 | 0.948229914 | 0.255151188 |
| 0.00096 | 6.031858 | −0.04123 | 0 | −0.041229401 | 0.213921787 |
| 0.00097 | 6.09469 | −0.03075 | 0 | −0.030745013 | 0.183176774 |
| 0.00098 | 6.157522 | −0.02035 | 0 | −0.020354494 | 0.162822281 |
| 0.00099 | 6.220353 | −0.01009 | 0 | −0.010094365 | 0.152727915 |
| 0.001 | 6.283185 | 1.94E−15 | 0 | 1.94001E−15 | 0.152727915 |

The system and methods described herein may be embodied in other specific forms without departing from the spirit or essential characteristics thereof. The foregoing embodiments are therefore to be considered in all respects illustrative and not meant to be limiting.

What is claimed is:

1. A signal processing device, comprising:
a plurality of delay elements connected in series, wherein an input continuous time signal to be processed is supplied to said plurality of delay elements and is delayed in time by successive ones of the delay elements and a total delay across the plurality of delay elements connected in series is equal to or greater than a period corresponding to a lowest frequency to be filtered in the input continuous time signal;
a plurality of amplifiers, each amplifier coupled to receive as input an output of a corresponding delay element and which applies a corresponding coefficient to its input to produce a weighted signal as an output; and
a summing circuit that combines the weighted signals produced by the plurality of amplifiers to produce a processed output signal;
wherein the coefficients of the plurality of amplifiers are set to values so as to perform a desired filtering or processing function of the input continuous time signal in producing the processed output signal.

2. The device of claim 1, wherein the coefficients for the plurality of amplifiers are −1, 0 or +1.

3. The device of claim 2, wherein the amplifiers are single transistor amplifier circuits that are configurable to pass a signal at its input unchanged for a coefficient of +1, invert the signal at its input for a coefficient of −1 or block the signal at is input for a coefficient of 0.

4. The device of claim 3, and further comprising a memory that stores values for the amplifier coefficients that when applied to the plurality of delayed signals achieve a desired filtering function, and a control unit that configures the plurality of single transistor amplifier circuits according to the value of its corresponding coefficient stored in the memory.

5. The device of claim 4, wherein the memory stores multiple sets of values for the amplifier coefficients, wherein each set of values corresponds to a particular filtering function or characteristic, and wherein the control unit configures the plurality of single transistor amplifier circuits using one of the sets of values depending on a filtering or processing function to be applied.

6. The device of claim 1, wherein each of the delay elements delays the signal by an equal amount that is a fraction of a period of said input continuous time signal.

7. The device of claim 1, and further comprising a memory that stores values for the amplifier coefficients to achieve a desired filtering or processing function, and a control unit that configures the plurality of amplifiers according to the value of its corresponding coefficient stored in the memory.

8. The device of claim 1, wherein each amplifier applies its corresponding coefficient to its input by multiplying a signal at its input by its corresponding coefficient.

9. In combination, the device of claim 1, and an analog-to-digital converter, wherein the input continuous time signal is an analog signal to be converted to a digital signal by the analog-to-digital converter, and wherein the coefficients applied by the plurality of amplifiers are set to values that reduce a bandwidth of said analog signal prior to conversion to a digital signal by the analog-to-digital converter.

10. In combination, the device of claim 1, and a controller that sets values for said coefficients applied said plurality of amplifiers.

11. The combination of claim 10, wherein said controller sets values for said coefficients to perform one or more filtering or processing functions associated with one or more wired or wireless communication standards.

12. A phase-locked loop system comprising the device of claim 1.

13. The phase-locked loop system of claim 12, and further comprising a phase detector circuit, a charge pump circuit and an oscillator circuit, wherein the input continuous time signal is an output of the charge pump circuit and the processed output signal is coupled as a control input to the oscillator circuit, and wherein the phase detector circuit has a first input that is coupled to a reference signal and a second input that is coupled to an output of the oscillator circuit and an output of the phase detector circuit is connected to said charge pump circuit.

14. A signal filtering system comprising first and second signal processing devices of claim 1, wherein the first signal processing device comprises a first plurality of delay elements connected to a first plurality of amplifiers and wherein the input continuous time signal is coupled as input to said first plurality of delay elements, and the second signal processing device comprises a second plurality of delay elements connected to a second plurality of amplifiers, and wherein the first plurality of amplifiers apply corresponding ones of a first plurality of coefficients to corresponding outputs of the first plurality of delay elements to produce a first plurality of weighted signals and the second plurality of amplifiers apply corresponding ones of a second plurality of coefficients to outputs of the second plurality of delay elements to produce a second plurality of weighted signals, and wherein the summing circuit combines the first plurality of weighted signals and second plurality of weighted signals to produce said processed output signal, and wherein said processed output signal is coupled as input to said second plurality of delay elements.

15. The signal filtering system of claim 14, wherein the first plurality of coefficients and the second plurality of coefficients are set to values to achieve an infinite impulse filtering function on the input continuous time signal in producing the processed output signal.

16. A method for processing a continuous time signal, comprising:
  successively delaying the continuous time signal by a delay amount to produce a plurality of delayed signals and such that a total delay across the plurality of delayed signals is equal to or greater than a period corresponding to a lowest frequency to be filtered in the continuous time signal; and
  applying a corresponding coefficient to some or all of the plurality of delayed signals to produce a plurality weighted signals; and
  combining said plurality of weighted signals to produce a processed output signal, and wherein the coefficients applied to some or all of the delayed signals are set to values so as to perform a desired filtering or processing function of the continuous time signal in producing the processed output signal.

17. The method of claim 16, wherein applying comprises a coefficient of −1, 0 or +1 to each of the plurality of delayed signals.

18. The method of claim 16, and further comprising storing values for the coefficients that, when applied to said plurality of delayed signals, achieve the desired filtering or processing function.

19. The method of claim 18, wherein storing comprises storing multiple sets of values for the amplifier coefficients, wherein each set of values corresponds to a particular filtering or processing function.

20. The method of claim 16, wherein successively delaying comprises successively delaying the continuous time signal by an equal amount that is a fraction of a period of the continuous time signal to be filtered.

21. A signal processing device, comprising:
  means for successively delaying an input continuous time signal to be processed by a delay amount to produce a plurality of delayed signals and such that a total delay across the plurality of delayed signals is equal to or greater than a period corresponding to a lowest frequency to be filtered in the input continuous time signal;
  means for applying a corresponding coefficient to some or all of the plurality of delayed signals to produce a plurality of weighted signals;
  means for combining the plurality of weighted signals to produce a processed output signal;
  wherein coefficients applied by said means for applying are set to values so as to perform a desired filtering or processing function of said input continuous time signal in producing said processed output signal.

22. The device of claim 21, wherein said means for applying applies a coefficient of −1, 0 or +1 to a corresponding one of the plurality of delayed signals.

23. The device of claim 21, and further comprising means for storing values for the amplifier coefficients used by said means for applying to achieve a desired filtering or processing function.

24. The device of claim 21, wherein said means for successively delaying successively delays said continuous time signal by an equal delay amount that is a fraction of a period of the said input continuous time signal.

25. In combination, the device of claim 21 and means for converting said input continuous time signal to a digital signal, wherein the coefficients applied by said means for applying are values that reduce a bandwidth of said input continuous time signal prior to conversion to a digital signal by said means for converting and said means for converting operates on said processed output signal to produce said digital signal.

26. The combination, of claim 25, and further comprising means for setting values for said coefficients that are applied by said means for applying.

27. The combination of claim 26, wherein said means for setting sets values for said coefficients to perform one or more filtering or processing functions associated with one or more wired or wireless communication standards.

28. A signal filtering system comprising:
a first plurality of delay elements connected in series and configured to receive an input continuous time signal to be processed, wherein the first plurality of delay elements are configured to delay the input continuous time signal in time by successive delay amounts;
a first plurality of amplifiers, each of which is coupled to receive as input an output of a corresponding delay element and to apply a corresponding one of a first plurality of coefficients such that the first plurality of amplifiers produce a first plurality of weighted signals;
a second plurality of delay elements connected in series and configured to receive as input a processed output signal, wherein the second plurality of delay elements are configured to delay in time by successive delay amounts the processed output signal;
a second plurality of amplifiers, each of which is coupled to receive as input an output of a corresponding delay element and to apply a corresponding one of a second plurality of coefficients such that the second plurality of amplifiers produce a second plurality of weighted signals; and
a summing circuit configured to receive the first plurality of amplified signals and the second plurality of amplified signals, and to combine the first plurality of amplified signals and the second plurality of amplified signals to produce the processed output signal;
wherein the first plurality of coefficients and the second plurality of coefficients are set to values so as to perform a desired filtering or processing function of the input continuous time signal in producing the processed output signal.

29. The system of claim 28, wherein the first plurality of coefficients and the second plurality of coefficients are set to values to achieve an infinite impulse response filtering function on the input continuous time signal in producing the processed output signal.

30. The system of claim 28, and further comprising a memory that stores values for the first plurality of amplifier coefficients and values for the second plurality of amplifier coefficients, which when applied to the plurality of delayed signals, achieve a desired filtering function, and a control unit that configures the first plurality of amplifier circuits and the second plurality of amplifier circuits according to the values stored in the memory.

31. The system of claim 28, wherein delay amounts of the first plurality of delay elements are such that a total delay across the first plurality of delay elements is equal to or greater than a period corresponding to a lowest frequency to be filtered in the input continuous time signal.

32. A method, comprising:
successively delaying an input continuous time signal by a first plurality of delay elements connected in series to produce a first plurality of successively delayed signals;
applying a corresponding one of a first plurality of amplification coefficients to some or all of the first plurality of successively delay signals to produce a first plurality of weighted signals;
successively delaying by a second plurality of delay elements connected in series a processed output signal to produce a second plurality of successively delayed signals;
applying a corresponding one of a second plurality of amplification coefficients to some or all of the second plurality of successively delayed signals to produce a second plurality of weighted signals; and
combining the first plurality of amplified signals and the second plurality of amplified signals to produce the processed output signal.

33. The method of claim 32, and further comprising setting values for the first plurality of coefficients and values for the second plurality of coefficients which are configured to achieve an infinite impulse response filtering function on the input continuous time signal in producing the processed output signal.

34. The method of claim 32, wherein successively delaying the input continuous time signal with the first plurality of delay elements is such that a total delay across the first plurality of delay elements is equal to or greater than a period corresponding to a lowest frequency to be filtered in the input continuous time signal.

* * * * *